United States Patent [19]
Yang

[11] Patent Number: 6,110,523
[45] Date of Patent: Aug. 29, 2000

[54] METHOD OF MANUFACTURING A SEMICONDUCTOR MEMORY DEVICE

[75] Inventor: Doo Young Yang, Chungcheongbuk-do, Rep. of Korea

[73] Assignee: LG Semicon Co., Ltd., Cheongju, Rep. of Korea

[21] Appl. No.: 09/062,780

[22] Filed: Apr. 20, 1998

[30] Foreign Application Priority Data

Sep. 26, 1997 [KR] Rep. of Korea ............ 97/49216

[51] Int. Cl.[7] .................................................. B05D 5/12
[52] U.S. Cl. .................. 427/126.3; 427/240; 427/346; 427/372.2; 438/231; 438/236; 438/247
[58] Field of Search .............................. 427/126.3, 240, 427/346, 372.2; 437/231, 236, 247

[56] References Cited

PUBLICATIONS

"Ferroelectric Memory Device of Science Forum", p. 295. (No Date Avail).

*Primary Examiner*—Bernard Pianalto
*Attorney, Agent, or Firm*—Fleshner & Kim, LLP

[57] ABSTRACT

A semiconductor memory device and method of fabricating same is provided that has a plurality of ferroelectric memory cells and reference cells. The semiconductor memory device includes a capacitor of each memory cell being the same size as that of each reference cell. A voltage applied to each reference cell is higher than a voltage applied to each memory cell to read data out of the semiconductor memory device. A method of fabricating a ferroelectric substance for a semiconductor memory device includes dissolving zirconium n-butoxide and titanium iso-proxide in 2-methoxyethanol; chelating a resultant, obtained by dissolution, with acetylacetone; adding lanthanium (La) iso-proxide to the resultant and refluxing the resultant; adding lead (Pb) acetate trihydrate to the resultant, and stirring the resultant, using a nitric acid as a catalyzer; and carrying out spin-coating and thermal treatment processes on the resultant.

8 Claims, 6 Drawing Sheets

METHOD OF MANUFACTURING A SEMICONDUCTOR MEMORY DEVICE

BACKGROUND OF THE INVENTION

1. Field of the Invention

The present invention relates to a semiconductor memory device and method of fabricating the same, and in particular, to a ferroelectric memory device and method of manufacturing a ferroelectric.

2. Background of the Related Art

As semiconductor device integration increases, the capacitor area per unit cell is decreased, which in turn reduces the capacitance. The thickness of a dielectric film has been gradually decreased to compensate for the reduction of the capacitance. However, the decrease in the thickness of the dielectric film causes a high leakage current problem, which lowers the reliability of the semiconductor device.

To solve the high leakage current problem, a very complicated surface undulation can be created, which increases the effective area of a capacitor. However, the surface undulation technique makes photolithography difficult and raises the manufacturing costs, which is disadvantageous to a semiconductor device of high integration.

Research devoted to planarization, in contrast to the surface undulation technique that increased the capacitance, proposed a technique employing a material of high permittivity as a dielectric film. A capacitor made of the high dielectric film has several advantages, however, the scope of its use is limited since its actual permittivity is not very high when the increased integration of semiconductor devices is taken into consideration. Perovskite, a ferroelectric whose crystal structure is ideally cubic, was investigated as a material to be used in a semiconductor device. A ferroelectric is a crystalline substance displaying ferroelectricity (i.e., spontaneous electric polarization) when heated below its Curie temperature without applying electric field. Ferroelectrics include PZT (Pb (Zr, Ti) $O_3$), PLZT ((Pb, La)(Zr, Ti)$O_3$), BST ((Ba, Sr)$TiO_3$), $BaTiO_3$, and $SrTiO_3$.

Such ferroelectrics react on silicon or silicide, and its surface is exposed in a strong acid atmosphere, thus causing various problems such as oxidization of electrodes. Suitable materials and structures for electrodes are being investigated to solve those problems. Since the ferroelectric is an oxide, electrodes should be made of conductive materials that are not easily oxidized. Accordingly, platinum (Pt) is generally used as an electrode. FeRAM, a non-volatile memory device, is identical to dynamic random access memory (DRAM) in structure, but employs a ferroelectric as a capacitor. In contrast, DRAM (volatile memory device) uses a paraelectric material as a capacitor. FeRAM assures a low-voltage and high-speed performance, and does not require periodic refresh to prevent loss of information during standby intervals.

FIG. 1 illustrates a related hysteresis loop, and FIG. 2 graphically depicts charge-voltage characteristics of a related art ferroelectric. As shown in FIG. 1, the relation between polarization and applied electric field (P-E) of a ferroelectric is not shown by a straight line on a graph but is displayed on a hysteresis loop. According to the hysteresis loop, a direction of the spontaneous electric polarization may be inverted by changing a direction of the applied voltage. In FIG. 1, P is flux density, E is an applied electric field and Pr is retentivity.

As shown in FIG. 2, a capacitor for a feRAM is made of a ferroelectric that exhibits electrical properties analogous to certain magnetic properties, not paraelectric. The ferroelectric has two kinds of electric charges, opposite to each other in state, without application of voltage. At this point, "1" and "0" respectively denote a negative charge and a positive charge, and Q1, Q0, Qr, and Qs respectively designate a quantity of charge displacement, a quantity of displaced charges, a quantity of retentivity and a quantity of saturated charges.

FIG. 3 illustrates a circuit diagram of related art 1 transistor/1 capacitor structure, and FIG. 4 illustrates a timing diagram of FIG. 3. FIG. 5 graphically depicts charge-voltage characteristics of a related art ferroelectric. As shown in FIG. 3, the related 1 transistor/1 capacitor structure includes a word line W/L connected to a gate of a memory cell 1 in one direction, a bit line B/L that is perpendicular to the word line W/L connected to a drain of the memory cell 1 and a ferroelectric capacitor C connected to a source of the memory cell 1. A data line D/L that is parallel to the word line W/L is connected to the ferroelectric capacitor C and a sense amplifier SA is connected to the bit line B/L for sensing data. A reference cell 2 is also connected to any one of input terminals of the sense amplifier SA for generating a reference voltage.

The operation of the related art semiconductor memory device will now be described. A capacitor of the reference cell 2 is half the size of the capacitor of the memory cell 1 and a driving voltage applied to the reference cell 2 is the same as the memory cell 1. As shown in FIGS. 3, 4 and 5, a high-level signal is applied to the word line W/L to turn on a transistor Tr for storing "1" in capacitor C of memory cell 1. A pulse is applied to bit line B/L to make ferroelectric capacitor C of each of the memory cell 1 and the reference cell 2 "1".

To read out "1", a high-level signal is applied to word line W/L to turn on transistor Tr. A pulse applied to data line D/L inverts ferroelectric capacitor C of memory cell 1. The sense amplifier SA compares Q1 (e.g., Q1 equals Qs+Qr), which is discharged to the bit line B/L, to a reference charge Qref of the reference cell 2. If Q1 of the memory cell 1 is larger than Qref of reference cell 2, the sense amplifier SA latches Q1 to produce a high-level signal to bit line B/L. "1" is restored through the above steps. At this point, Qref of reference cell 2 equals to Qr of memory cell 1.

To store "0" in the capacitor C of the memory cell 1, a high-level signal is applied to the word line W/L to turn on the transistor Tr, and a pulse is applied to the data line D/L to make the ferroelectric capacitor C of each of the memory cell 1 and the reference cell 2 "0".

To read out "0", a pulse is applied to data line D/L not to invert ferroelectric capacitor C of memory cell 1. The sense amplifier SA compares Q0 (e.g., Q0 equals Qs−Qr),which is discharged to the bit line B/L, with the reference charge Qref of reference cell 2. If Q0 of the memory cell 1 is smaller than Qref of the reference cell 2, the sense amplifier SA latches a low-level signal not to produce a high-level signal to bit line B/L so that data remains "0". At this point, if Qref of reference cell 2 is larger than Q0 and smaller than Q1, "1" can be distinguished from "0", and a sensing margin becomes maximum. That is, since Q1−Q0 equals 2Qr, it is preferable that Qref equals Qr.

As described above, the related art memory device has various problems. When reading data out of selected memory cells each connected to bit lines, corresponding reference cells are selected and generate a reference charge by polarization/inversion, which causes fatigue of the reference cells. In addition, when the reference potential produced from the reference cells is decreased to an amount smaller than the quantity of displaced charges, "1" cannot be distinguished from "0".

SUMMARY OF THE INVENTION

An object of the present invention is to provide a method of fabricating a semiconductor memory device that substantially obviates one or more of the problems caused by limitations and disadvantages of the related art.

Another object of the present invention to provide a semiconductor device and method of fabricating the same that precludes fatigue of reference cells.

A further object of the present invention is to provide a non-volatile ferroelectric random access memory and a method for fabricating the same with increased operational time.

A still further object of the present invention is to provide a ferroelectric and a method of manufacturing the ferroelectric for a semiconductor device.

To achieve at least these and other advantages in a whole or in parts and in accordance with the purpose of the present invention, as embodied and broadly described, there is disclosed a semiconductor device with a plurality of memory cells and reference cells, including a capacitor of each memory cell being substantially equal in size with a capacitor of each reference cell, and a voltage applied to each reference cell being higher than a voltage applied to each memory cell to read data out of the semiconductor device.

To further achieve such advantages in a whole or in parts, a method of fabricating a ferroelectric substance for a semiconductor memory device, according to the present invention includes the steps of dissolving zirconium n-butoxide and titanium iso-proxide in 2-methoxyethanol; chelating a resultant, obtained by dissolution, with acetylacetone; adding lanthanium (La) iso-proxide to the resultant and refluxing the resultant; adding lead (Pb) acetate trihydrate to the resultant, and stirring the resultant, using a nitric acid as a catalyzer; and carrying out spin-coating and thermal treatment processes on the resultant.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
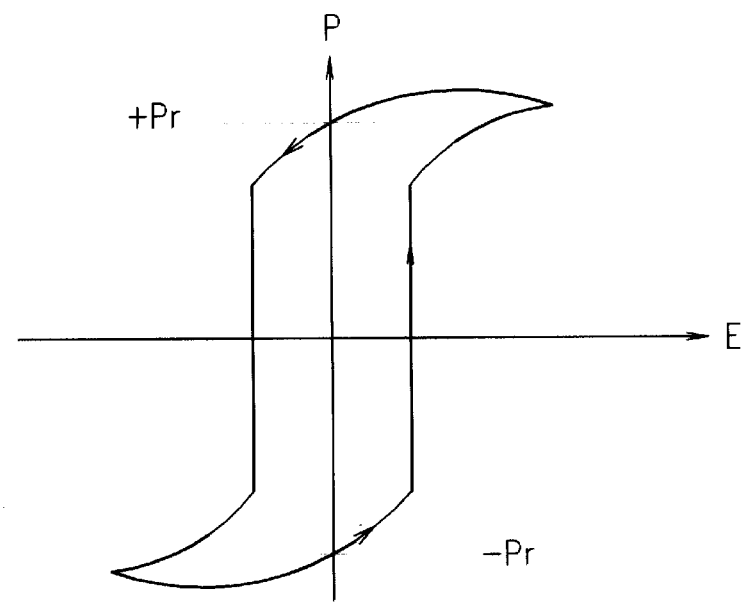
FIG. 1 is a diagram showing a related art hysteresis loop.
Figure 2:
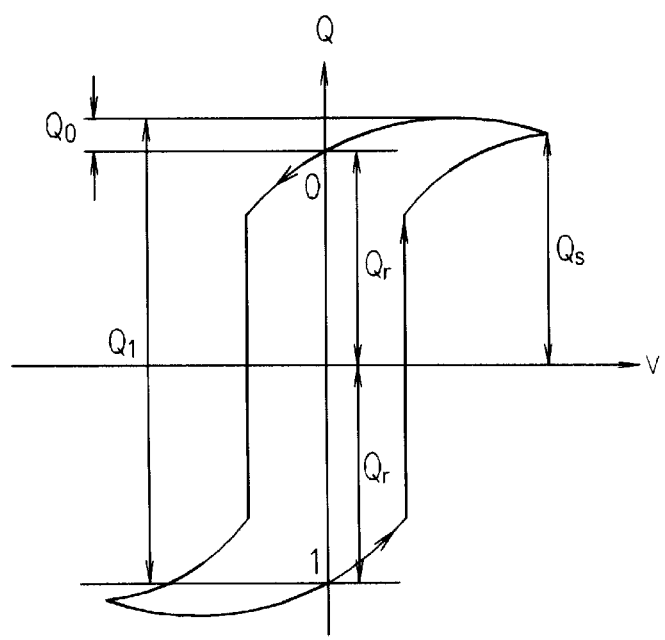
FIG. 2 is a diagram graphically showing charge-voltage characteristics of a related art ferroelectric.
Figure 3:
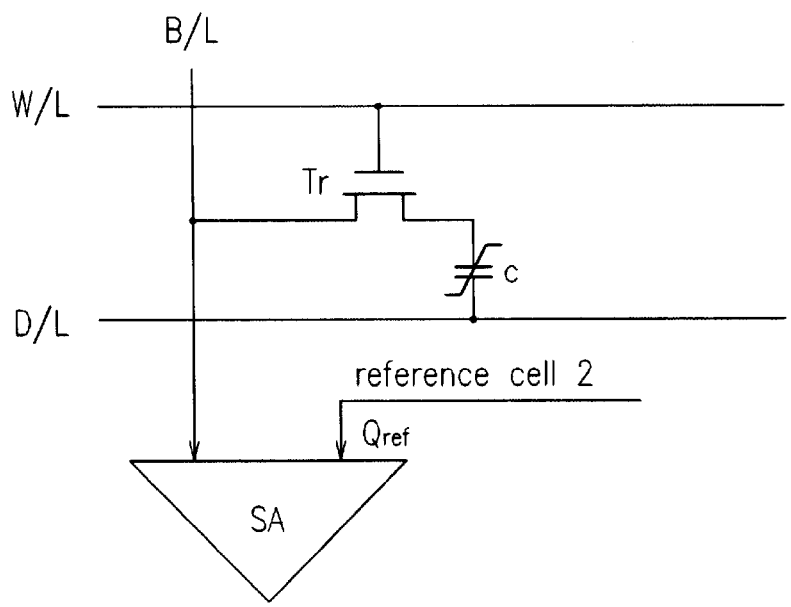
FIG. 3 is a circuit diagram showing a related art 1-transistor/1 capacitor device.
Figure 4:
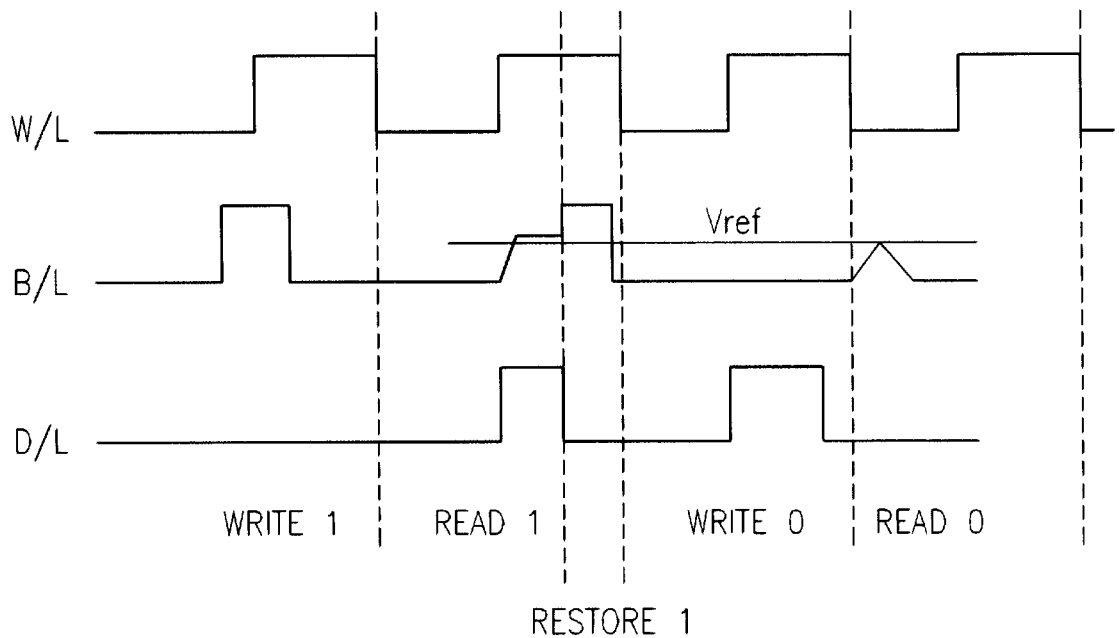
FIG. 4 is a diagram showing timing waveforms of the device of FIG. 3.
Figure 5:
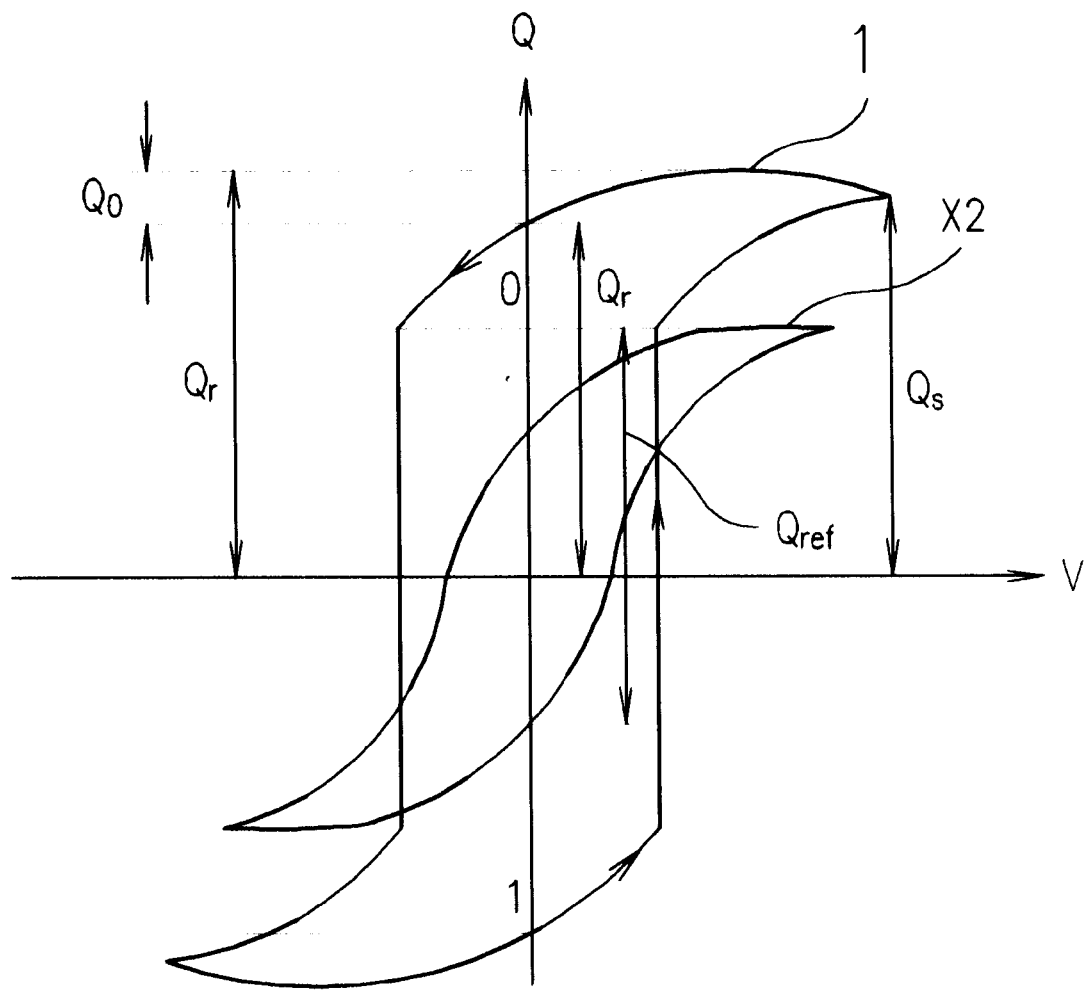
FIG. 5 is a diagram graphically showing charge-voltage characteristics of a related art ferroelectric.
Figure 6A:
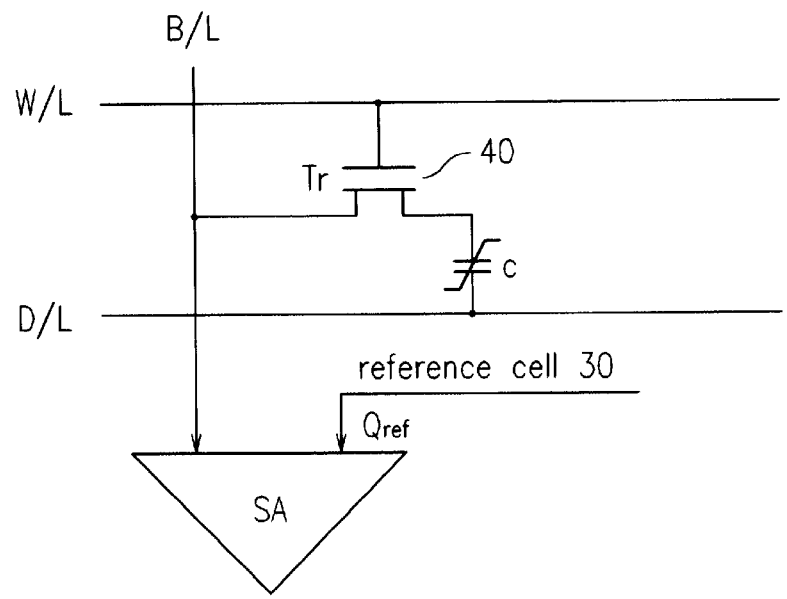
FIG. 6A is a circuit diagram showing a preferred embodiment of a 1 transistor/1-capacitor device in accordance with the present invention.

As shown in FIG. 6A, a first preferred embodiment of 1 transistor/1 capacitor semiconductor device includes word line W/L extending in one direction coupled to a gate of memory cell 40. A bit line B/L is coupled to a drain of the memory cell 40 and extends in a second direction that is perpendicular to word line W/L. A ferroelectric capacitor C is coupled to a source of memory cell 40. A data line D/L is coupled to ferroelectric capacitor C and extends parallel to word line W/L. A sense amplifier SA is coupled to bit line B/L for sensing data and a reference cell 30 for generating a reference voltage is coupled to any one of input terminals of sense amplifier SA.

Operations of the semiconductor memory device according the first preferred embodiment will now be described. A capacitor of reference cell 30 is preferably the same size as a capacitor of memory cell 40, and a driving voltage Vr applied to reference cell 30 is preferably higher than a driving voltage Vm of memory cell 40. Further, driving voltage Vr of reference cell 30 is preferably higher than a voltage at the time of reading a high-level signal out of memory cell 40 and lower than a voltage at the time of reading a low-level signal out of memory cell 40. Thus, the high-level signal is distinguished from the low-level one.

Figure 6B:
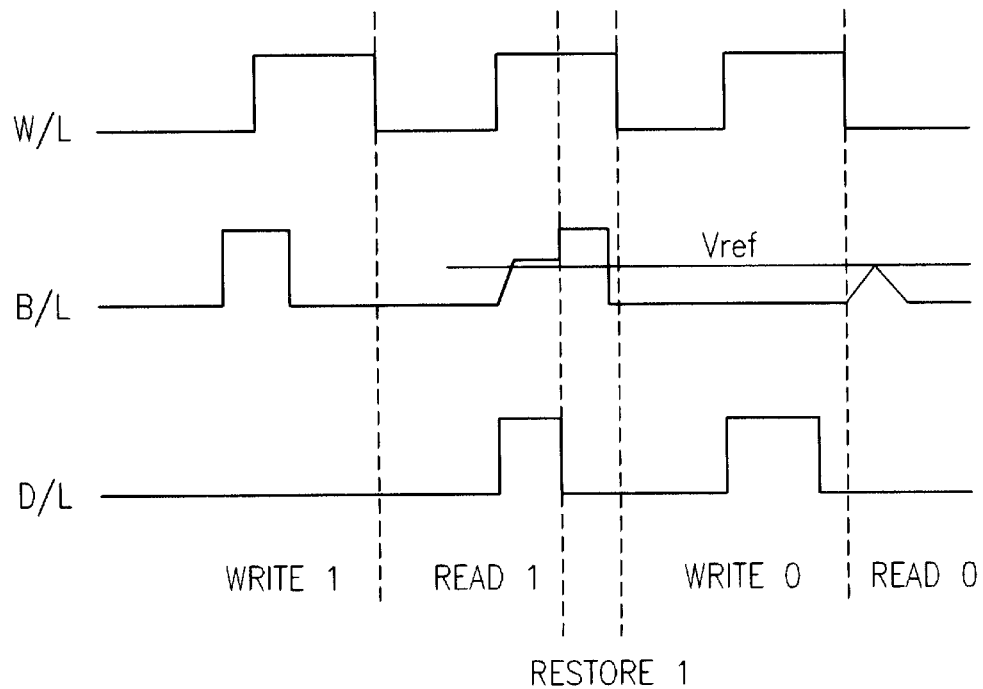
FIG. 6B is a diagram showing timing waveforms of the device of FIG. 6A.
Figure 7:
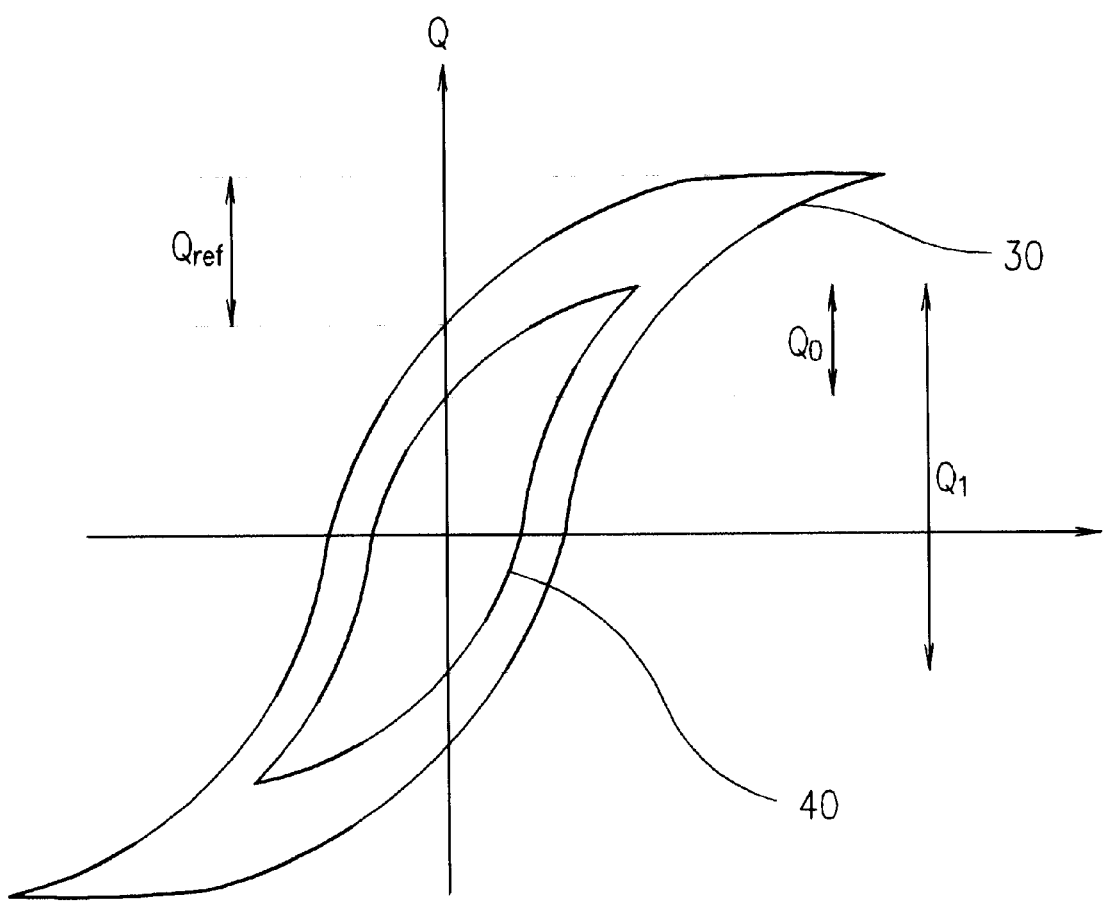
FIG. 7 is a diagram graphically showing exemplary charge-voltage characteristics of a ferroelectric in accordance with the present invention.
Figure 8:
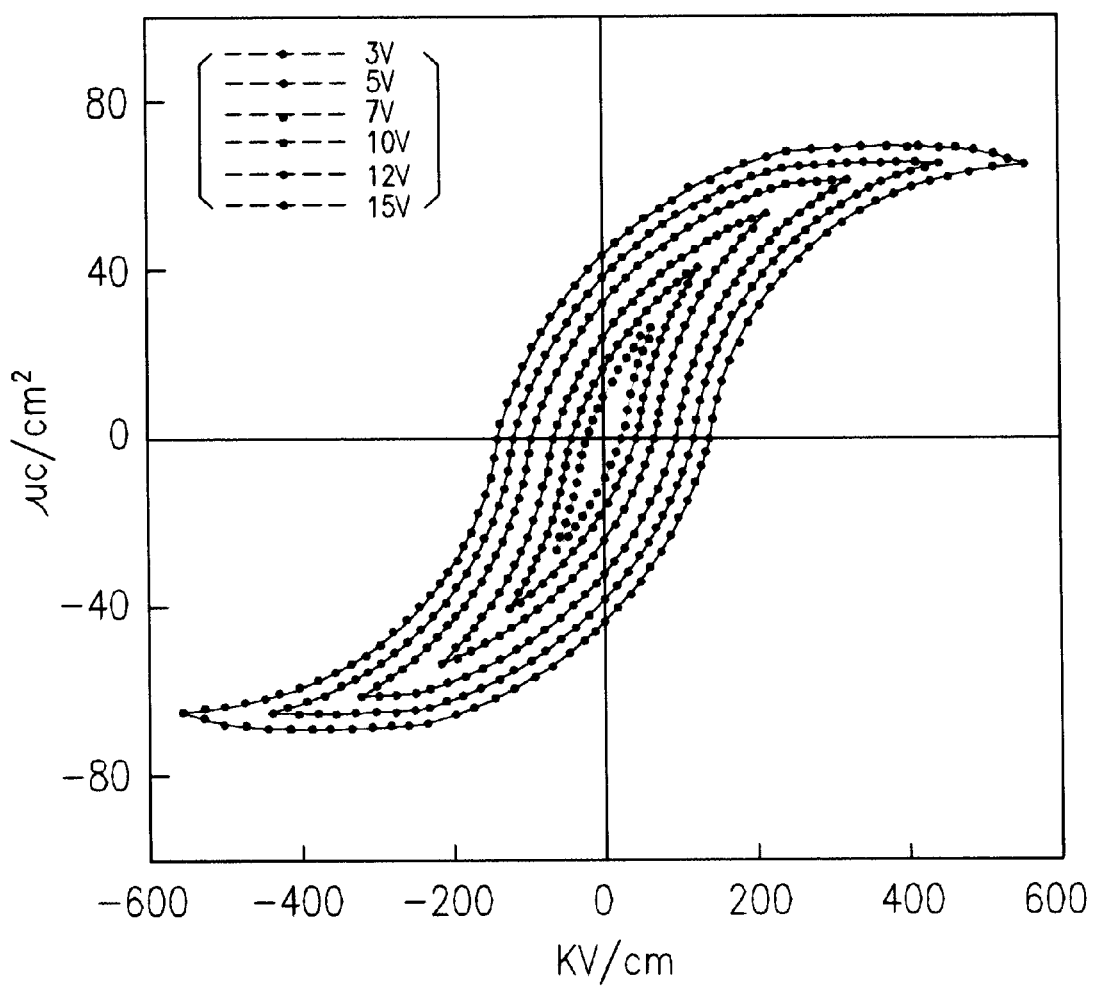
FIG. 8 is a diagram showing a hysteresis loop according to a driving voltage.

As shown in FIGS. 6A, 6B and 7, a high-level signal is applied to word line W/L to turn on a transistor Tr for storing "1" in capacitor C of non-volatile memory cell 40. Driving voltage Vm of memory cell 40 is applied to bit line B/L to make ferroelectric capacitor C of memory cell 40 "1".

To read out "1", a high-level signal is applied to word line W/L to turn on transistor Tr and driving voltage Vm of memory cell 40 is applied to data line D/L to invert ferroelectric capacitor C of memory cell 40. Sense amplifier SA compares Q1, which is a quantity of charge displacement discharged to bit line B/L, to a reference charge Qref of reference cell 30. If Q1 of memory cell 40 is larger than Qref of reference cell 30, sense amplifier SA latches Q1 to produce a high-level signal to bit line B/L. "1" is restored through the above steps.

To store "0" in capacitor C of non-volatile memory cell 40, driving voltage Vm of memory cell 40 is applied to data line D/L to make capacitor C "0".

To read out "0", driving voltage Vm of memory cell 40 is applied to data line D/L that does not invert ferroelectric capacitor C of memory cell 40. Sense amplifier SA compares Q0, which is a quantity of displaced charges discharged to bit line B/L, to reference charge Qref of reference cell 30. If Q0 of memory cell 40 is smaller than Qref of reference cell 30, sense amplifier SA latches Q0 as low level and does not produce a high-level signal to bit line B/L so that data remains "0". At this point, if Qref of reference cell 30 is larger than Q0 and smaller than Q1, "1" can be distinguished from "0", and a sensing margin is maximized. Therefore, Qref of reference cell 30 preferably equals (Q0+Q1)/2.

A second preferred embodiment according to the present invention is a ferroelectric that controls a hysteresis loop (Ps, Pr and Ec) to generate a reference voltage with Qref of the reference cell without polarization or electric displacement. The reference voltage is required by the sense amplifier.

A third preferred embodiment according to the present invention is a method of fabricating a ferroelectric. According to the third preferred embodiment, zirconium (Zr) n-butoxide and titanium (Ti) iso-proxide are dissolved in 2-methoxyethanol to chelate the resultant with acetylacetone. Lanthanium (La) iso-proxide is added, and the resultant is refluxed at 60° C. After that, lead (Pb) acetate trihydrate is added. The resultant is stirred for 24 hours, using nitric acid as catalyzer. The maximum amount of Pb is in a range of approximately 5 to 15% based on the creation of morphotropic of PZT. The amount of La is in a range of approximately 1 to 7.5%. The ferroelectric is made by thermal treatment at 550 to 750° C. by using a spin coating method.

As described above, a method of fabricating a semiconductor memory device according to the preferred embodiments can prevent deterioration to characteristics of the memory device due to the fatigue by using the reference cell more than the memory cell without polarization/electric displacement. Accordingly, the preferred embodiments according to the present invention may assure a long life for the non-volatile ferroelectric memory cell of 1 transistor and 1 capacitor.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating a semiconductor device comprising the steps of:

dissolving zirconium (Zr) n-butoxide and titanium (Ti) iso-proxide in 2-methoxyethanol;

chelating a first resultant with acetylacetone;

adding lanthanium (La) iso-proxide to create a second resultant and refluxing the second resultant;

adding lead (Pb) acetate trihydrate to a third resultant to create a fourth resultant, and stirring the fourth resultant; and applying the fourth resultant to a substrate by spin-coating and thermally treating the coated substrate.

2. The method according to claim 1, wherein the fourth resultant is stirred approximately 22 to 26 hours using nitric acid as a catalyzer.

3. The method according to claim 1, wherein an amount of lead is approximately in the range of 5 to 15% based on an amount of morphotropic of PZT.

4. The method according to claim 3, wherein the amount of lead is in a raw material state.

5. The method according to claim 1, wherein an amount of the lanthanium (La) iso-proxide is approximately in the range of 1 to 7.5%.

6. The method according to claim 1, wherein the spin-coating and thermal treatment processes are carried out at approximately 550 to 750° C.

7. The method according to claim 1, wherein the first resultant is obtained by the dissolving step.

8. The method according to claim 1, wherein the second resultant is refluxed at approximately 60° C.

* * * * *